(12) United States Patent
Kovacic et al.

(10) Patent No.: US 11,585,444 B2
(45) Date of Patent: Feb. 21, 2023

(54) SEAL FOR A FLOW RESTRICTOR

(71) Applicant: Ichor Systems, Inc., Fremont, CA (US)

(72) Inventors: Matthew Eric Kovacic, Reno, NV (US); Zachariah Ezekiel McIntyre, Houston, TX (US); Sean Joseph Penley, Sparks, NV (US); Christopher Bryant Davis, Georgetown, TX (US)

(73) Assignee: Ichor Systems, Inc.

( * ) Notice: Subject to any disclaimer, the term of this patent is extended or adjusted under 35 U.S.C. 154(b) by 38 days.

(21) Appl. No.: 16/985,635

(22) Filed: Aug. 5, 2020

(65) Prior Publication Data

US 2021/0041027 A1 Feb. 11, 2021

Related U.S. Application Data (60) Provisional application No. 62/882,814, filed on Aug. 5, 2019.

(51) Int. Cl.
  *F16K 1/52* (2006.01)
  *F15D 1/02* (2006.01)
  *H01L 21/67* (2006.01)

(52) U.S. Cl.
  CPC .............. *F16K 1/526* (2013.01); *F15D 1/025* (2013.01); *H01L 21/67017* (2013.01)

(58) Field of Classification Search
  CPC .......... F16K 1/526; F16K 1/465; F15D 1/025; H01L 21/67012; Y10T 137/8049; Y10T 137/8122
  USPC ................. 138/40, 41, 42, 44; 251/118–127; 277/607; 137/547, 550
  See application file for complete search history.

(56) References Cited

U.S. PATENT DOCUMENTS

| | | | | |
|---|---|---|---|---|
| 1,883,720 A | * | 10/1932 | Grimes | A62C 35/645 138/41 |
| 2,173,022 A | * | 9/1939 | Mitchell | E21B 34/16 138/46 |
| 2,672,159 A | * | 3/1954 | Walton | E21B 34/02 138/44 |
| 3,018,799 A | * | 1/1962 | Hartzell | F16L 55/045 417/151 |
| 3,071,160 A | | 1/1963 | Weichbrod | |
| 3,145,529 A | * | 8/1964 | Maloof | F02K 9/974 138/44 |

(Continued)

FOREIGN PATENT DOCUMENTS

JP    2007-041870    2/2007

OTHER PUBLICATIONS

International Search Report mailed in International Patent Application No. PCT/US20/44991 dated Oct. 26, 2020.

*Primary Examiner* — William M McCalister
(74) *Attorney, Agent, or Firm* — The Belles Group, P.C.

(57) ABSTRACT

Apparatuses for controlling gas flow are important components for delivering process gases for semiconductor fabrication. These apparatuses for controlling gas flow frequently rely on effectively sealed flow restrictors which can eliminate leakage of process gas around the flow restrictors. In one embodiment, a seal for a flow restrictor is disclosed, the seal comprising a plastic cylinder which is shrink fit onto a sealing portion of the flow restrictor. In another embodiment, a seal for a flow restrictor is disclosed, the seal having a first sealing ring with a flow aperture, a flow restrictor installed into the flow aperture.

20 Claims, 13 Drawing Sheets

(56) References Cited

U.S. PATENT DOCUMENTS

| | | | | |
|---|---|---|---|---|
| 3,789,880 A | * | 2/1974 | Armstrong | F16K 3/32 138/44 |
| 3,840,048 A | * | 10/1974 | Moen | F16K 11/085 251/363 |
| 3,851,526 A | * | 12/1974 | Drexel | G01F 5/00 73/202 |
| 3,921,672 A | * | 11/1975 | Arnold | F16L 55/027 138/44 |
| 4,032,457 A | * | 6/1977 | Matchett | B01D 39/00 210/489 |
| 4,070,005 A | | 1/1978 | McJones | |
| 4,450,718 A | | 5/1984 | Hartemink | |
| 4,497,202 A | | 2/1985 | Mermelstein | |
| 4,550,896 A | * | 11/1985 | Hansen, III | F16K 27/029 251/366 |
| 4,662,401 A | * | 5/1987 | Zingg | F15C 1/20 138/44 |
| 4,911,481 A | * | 3/1990 | Oberdorfer-Bogel | B08B 3/02 138/44 |
| 4,930,791 A | * | 6/1990 | Ungchusri | F16L 17/06 285/354 |
| 5,070,909 A | * | 12/1991 | Davenport | F16K 5/0605 251/315.08 |
| 5,097,866 A | * | 3/1992 | Shapiro-Baruch | F25B 41/30 137/550 |
| 5,267,584 A | * | 12/1993 | Smith | G05D 7/0629 137/13 |
| 5,318,073 A | * | 6/1994 | Kendrick | G01F 1/42 138/44 |
| 5,507,468 A | * | 4/1996 | Evans | F25B 41/38 251/118 |
| 5,576,498 A | * | 11/1996 | Shambayati | G01F 1/42 73/202.5 |
| 5,769,122 A | * | 6/1998 | Baumann | F16L 55/02718 137/625.33 |
| 5,836,356 A | * | 11/1998 | Desai | G01F 1/42 138/44 |
| 5,863,129 A | * | 1/1999 | Smith | B01F 25/4323 138/42 |
| 5,979,668 A | * | 11/1999 | Kane | B01D 29/21 210/493.1 |
| 6,539,968 B1 | * | 4/2003 | White | G05D 7/0635 138/44 |
| 6,615,874 B2 | | 9/2003 | Thurston et al. | |
| 6,799,602 B2 | * | 10/2004 | Staton | F04B 49/24 138/40 |
| 7,240,693 B2 | * | 7/2007 | Knop | F16K 31/0655 137/550 |
| 7,363,940 B2 | * | 4/2008 | Oberley | F25B 41/38 138/44 |
| 7,431,045 B2 | | 10/2008 | Mudd et al. | |
| 7,896,026 B2 | * | 3/2011 | Choi | B62D 5/062 137/550 |
| 8,109,296 B2 | | 2/2012 | Minegishi et al. | |
| 8,365,765 B2 | * | 2/2013 | Bell | G01F 1/42 138/44 |
| 8,376,312 B2 | | 2/2013 | Mudd et al. | |
| 8,459,305 B2 | * | 6/2013 | Sutliff | F16K 1/2261 138/44 |
| 9,109,736 B2 | | 8/2015 | Yada et al. | |
| 10,386,003 B2 | * | 8/2019 | Kerr | F16L 55/02781 |
| 2002/0108654 A1 | * | 8/2002 | Vreeland | B01D 46/10 137/550 |
| 2004/0011198 A1 | * | 1/2004 | Keefer | B01D 53/06 96/125 |
| 2004/0163539 A1 | | 8/2004 | Fang | |
| 2005/0016604 A1 | * | 1/2005 | Steinke | F16K 47/08 137/625.3 |
| 2009/0230342 A1 | | 9/2009 | Komoto et al. | |
| 2011/0232843 A1 | | 9/2011 | Bowman et al. | |
| 2011/0297263 A1 | * | 12/2011 | Atkins | E03C 1/1222 138/44 |
| 2012/0111271 A1 | | 5/2012 | Begarney et al. | |
| 2012/0299252 A1 | | 11/2012 | Singh | |
| 2013/0037153 A1 | * | 2/2013 | Schommer | E03C 1/08 138/44 |
| 2013/0186499 A1 | | 7/2013 | Yada et al. | |
| 2014/0190578 A1 | | 7/2014 | Hayashi | |
| 2016/0124439 A1 | | 5/2016 | Yasuda et al. | |
| 2017/0025299 A1 | | 1/2017 | Sasaki et al. | |
| 2017/0241583 A1 | * | 8/2017 | Schinazi | A61M 5/141 |
| 2017/0269614 A1 | * | 9/2017 | Kuru | F16K 47/04 |
| 2018/0188700 A1 | * | 7/2018 | Penley | G05D 7/005 |

\* cited by examiner

SEAL FOR A FLOW RESTRICTOR

CROSS REFERENCE TO RELATED APPLICATIONS

The present application claims the benefit of U.S. Provisional Patent Application No. 62/882,814, filed Aug. 5, 2019, the entirety of which is incorporated herein by reference.

BACKGROUND OF THE INVENTION

Mass flow control has been one of the key technologies in semiconductor chip fabrication. Apparatuses for controlling mass flow are important for delivering known flow rates of process gases for semiconductor fabrication and other industrial processes. Such devices are used to measure and accurately control the flow of fluids for a variety of applications. This control may be achieved through the use of precisely calibrated flow restrictors and seals which ensure minimal leakage between the flow restrictors and the passages they are installed into.

As the technology of chip fabrication has improved, so has the demand on the apparatuses for controlling flow. Semiconductor fabrication processes increasingly require increased performance, including more accurate measurements, lower equipment costs, improved transient response times, and more consistency in timing in the delivery of gases. In order to improve the consistency in gas delivery, improved flow restrictors and their seals are desired.

SUMMARY OF THE INVENTION

The present technology is directed to a seal for a flow restrictor for use in a mass flow controller or other gas delivery device. One or more of these gas delivery devices may be used in a wide range of processes such as semiconductor chip fabrication, solar panel fabrication, etc.

In one implementation, the invention is a seal for a gas flow restrictor, the seal having a first end, a second end, and an aperture for receiving the flow restrictor to form a fluid tight connection between the flow restrictor and the seal.

In another implementation, the invention is a valve assembly, the valve assembly having a valve, a flow restrictor, and a seal. The valve has a passage. The flow restrictor has a first end, a second end, a longitudinal axis extending from the first end to the second end, and a sealing portion located between the first end and the second end along the longitudinal axis. The seal is in contact with the sealing portion of the flow restrictor and the passage of the valve.

In yet a further implementation, the invention is a valve assembly, the valve assembly having a valve, the valve having a first passage, a second passage, a first sealing recess, and a second recess. The valve assembly has a base having a third sealing recess and a fourth sealing recess. The valve assembly has a flow restrictor, the flow restrictor having a first end, a second end, a longitudinal axis extending from the first end to the second end, and a surface of the flow restrictor located between the first end and the second end along the longitudinal axis. Finally, the valve assembly has a seal in contact with the surface of the flow restrictor and the first sealing recess of the valve.

Further areas of applicability of the present technology will become apparent from the detailed description provided hereinafter. It should be understood that the detailed description and specific examples, while indicating the preferred implementation, are intended for purposes of illustration only and are not intended to limit the scope of the technology.

BRIEF DESCRIPTION OF THE DRAWINGS

The invention of the present disclosure will become more fully understood from the detailed description and the accompanying drawings, wherein.

DETAILED DESCRIPTION

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "left," "right," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combinations of features that may exist alone or in other combinations of features; the scope of the invention being defined by the claims appended hereto.

The present invention is directed to a seal for a flow restrictor for use in an apparatus for controlling gas flow. In some embodiments, the apparatus may function as a mass flow controller to deliver a known mass flow of gas to a semiconductor or similar process. Semiconductor fabrication is one industry which demands high performance in control of gas flows. As semiconductor fabrication techniques have advanced, customers have recognized the need for flow control devices with increased accuracy and repeatability in the mass of the delivered gas flows. Modern semiconductor processes require that the mass of the gas flow is tightly controlled, the response time minimized, and the gas flow is highly accurate. The present seals ensure that the flow restrictor is sealed into its flow passage more effectively and at a reduced cost.

Figure 1:
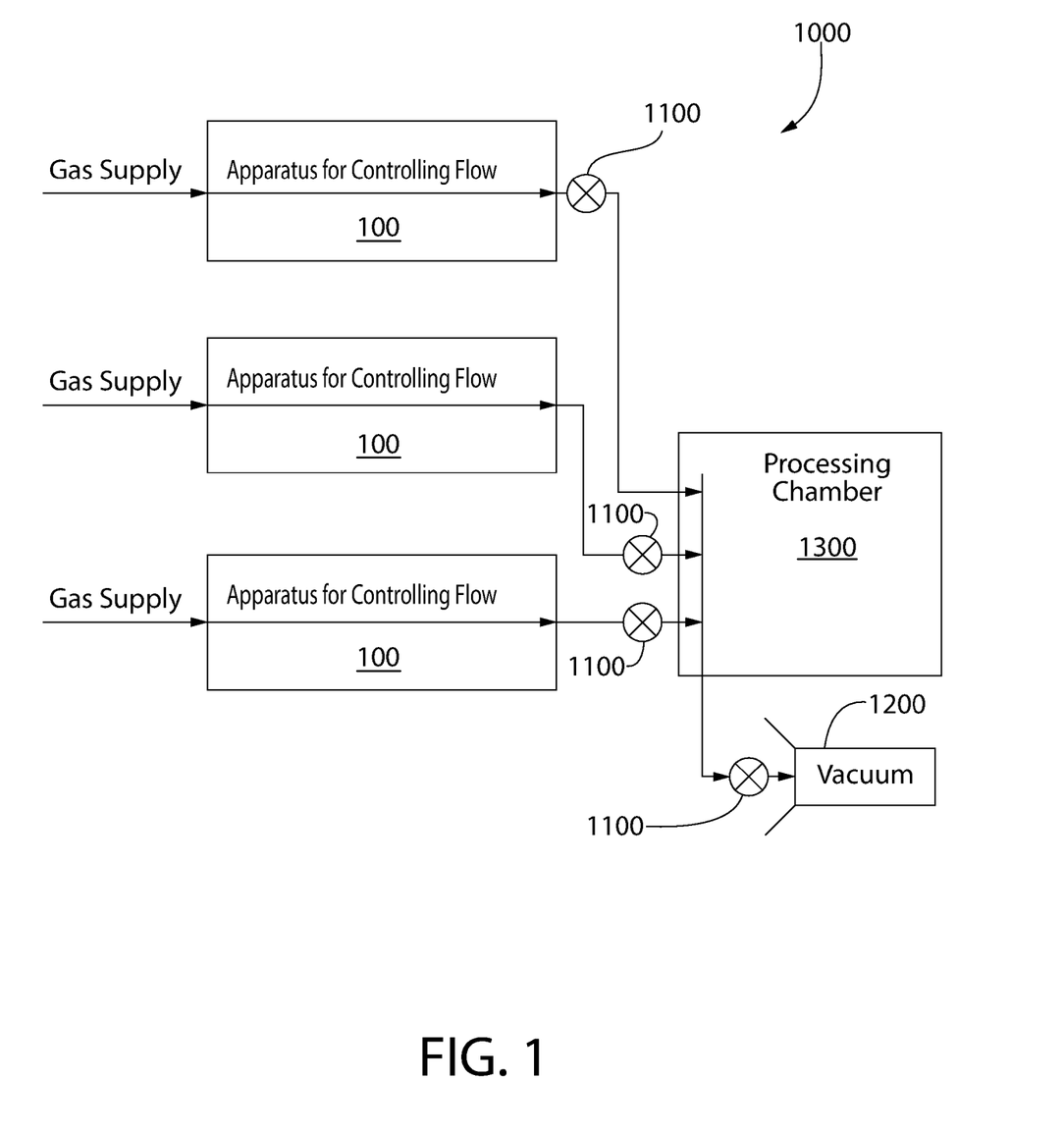
FIG. 1 is a schematic of a process utilizing one or more flow restrictors.

FIG. 1 shows a schematic of an exemplary processing system 1000 utilizing one or more flow restrictors. The processing system 1000 may utilize a plurality of apparatus for controlling flow 100 fluidly coupled to a processing chamber 1300. The plurality of apparatus for controlling flow 100 are used to supply one or more different process gases to the processing chamber 1300. Articles such as semiconductors may be processed within the processing chamber 1300. Valves 1100 isolate each of the apparatus for controlling flow 100 from the processing chamber 1300, enabling each of the apparatus for controlling flow 100 to be selectively connected or isolated from the processing chamber 1300, facilitating a wide variety of different processing steps. The processing chamber 1300 may contain an applicator to apply process gases delivered by the plurality of apparatus for controlling flow 100, enabling selective or diffuse distribution of the gas supplied by the plurality of apparatus for controlling flow 100. In addition, the processing system 1000 may further comprise a vacuum source 1200 which is isolated from the processing chamber 1300 by a valve 1100 to enable evacuation of process gases or facilitate purging one or more of the apparatus for controlling flow 100 to enable switching between process gases in the same apparatus for controlling flow 100. Optionally, the apparatus for controlling flow 100 may be mass flow controllers, flow splitters, or any other device which controls the flow of a process gas in a processing system. Furthermore, the valves 1100 may be integrated into the apparatus for controlling flow 100 if so desired.

Processes that may be performed in the processing system 100 may include wet cleaning, photolithography, ion implantation, dry etching, atomic layer etching, wet etching, plasma ashing, rapid thermal annealing, furnace annealing, thermal oxidation, chemical vapor deposition, atomic layer deposition, physical vapor deposition, molecular beam epitaxy, laser lift-off, electrochemical deposition, chemical-mechanical polishing, wafer testing, or any other process utilizing controlled volumes of a process gas.

Figure 2:
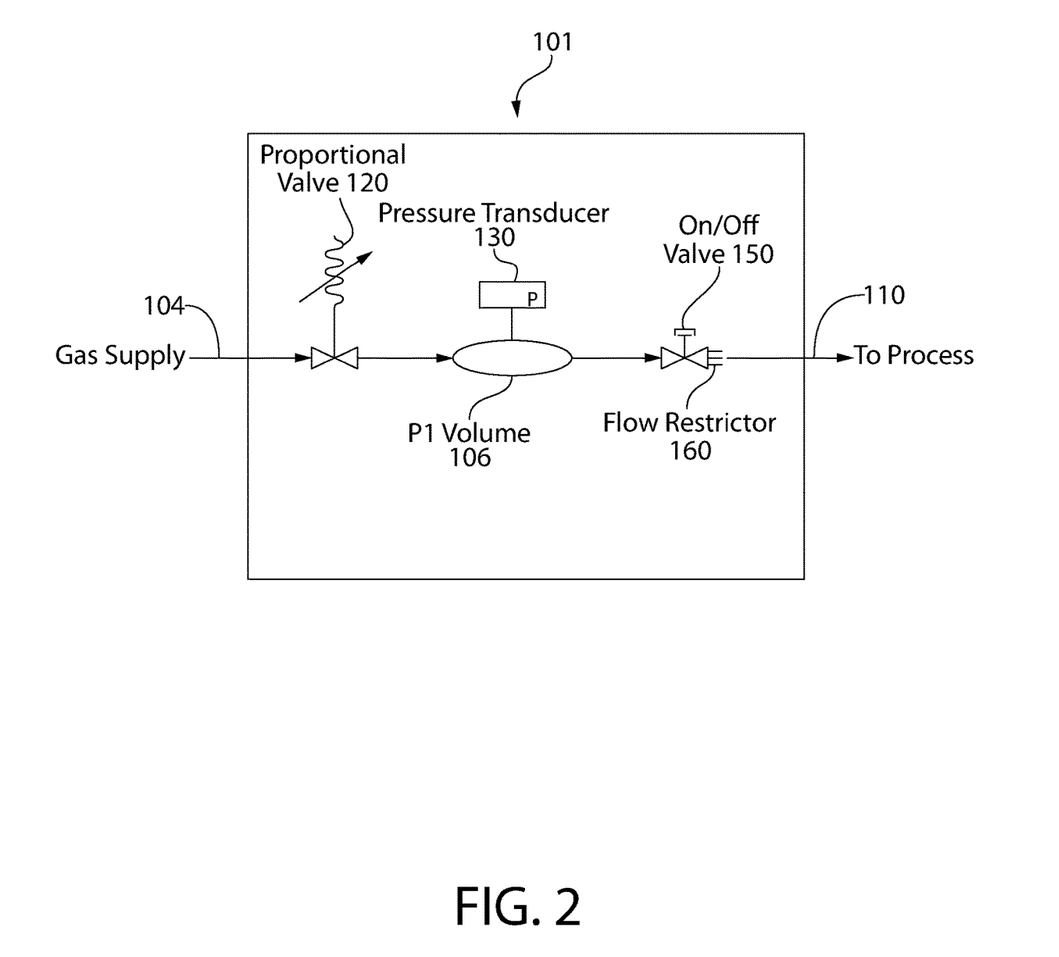
FIG. 2 is a schematic of a mass flow controller as may be utilized in the process of FIG. 1.

FIG. 2 shows a schematic of an exemplary mass flow controller 101, which is one type of apparatus for controlling flow 100 that may be utilized in the processing system 1000. The mass flow controller 101 has a gas supply of a process gas fluidly coupled to an inlet 104. The inlet 104 is fluidly coupled to a proportional valve 120 which is capable of varying the volume of process gas flowing through the proportional valve 120. The proportional valve 120 meters the mass flow of process gas which passes to the P1 volume 106. The proportional valve 120 is capable of providing proportional control of the process gas such that it need not be fully open or closed, but instead may have intermediate states to permit control of the mass flow rate of process gas.

A P1 volume 106 is fluidly coupled to the proportional valve 120, the P1 volume 106 being the sum of all the volume within the mass flow controller 101 between the proportional valve 120 and a flow restrictor 160. A pressure transducer 130 is fluidly coupled to the P1 volume 106 to enable measurement of the pressure within the P1 volume 106. An on/off valve 150 is located between the flow restrictor 160 and the proportional valve 120 and may be used to completely halt flow of the process gas out of the P1 volume 106. Optionally, the flow restrictor 160 may be located between the on/off valve 150 and the proportional valve 120 in an alternate configuration. Finally, the flow restrictor 160 is fluidly coupled to an outlet 110 of the mass flow controller 101. In the processing system, the outlet 110 is fluidly coupled to a valve 1100 or directly to the processing chamber 1300. In the present embodiment, the flow restrictor 160 is located between the on/off valve 150 and the outlet 110. In an alternate embodiment, the on/off valve 150 is located between the flow restrictor 160 and the outlet 110. Thus, the arrangement of the on/off valve 150 and the flow restrictor 160 may be reversed.

Internal to the first on/off valve 150 is a valve seat and a closure member. When the apparatus 100 is delivering process gas, the first on/off valve 150 is in an open state, such that the valve seat and the closure member are not in contact. This permits flow of the process gas and provides a negligible restriction to fluid flow. When the first on/off valve 150 is in a closed state the closure member and the valve seat are biased into contact by a spring, stopping the flow of process gas through the first on/off valve 150.

The flow restrictor 160 is used, in combination with the proportional valve 120, to meter flow of the process gas. In most embodiments, the flow restrictor 160 provides a known restriction to fluid flow. The first characterized flow restrictor 160 may be selected to have a specific flow impedance so as to deliver a desired range of mass flow rates of a given process gas. The flow restrictor 160 has a greater resistance to flow than the passages upstream and downstream of the flow restrictor 160.

Optionally, the mass flow controller 101 comprises one or more P2 pressure transducers downstream of the flow restrictor 160 and the on/off valve 150. The P2 pressure transducer is used to measure the pressure differential across the flow restrictor 160. In some embodiments, the P2 pressure downstream of the flow restrictor 160 may be obtained from another apparatus 100 connected to the processing chamber, with the readings communicated to the mass flow controller 101.

Optionally, temperature sensors may be employed to further enhance the accuracy of the mass flow controller 101. They may be mounted in the base of the mass flow controller 101 near the P1 volume 106. Additional temperature sensors may be employed in a variety of locations, including the proportional valve 120, the pressure transducer 130, and the on/off valve 150.

Figure 3:
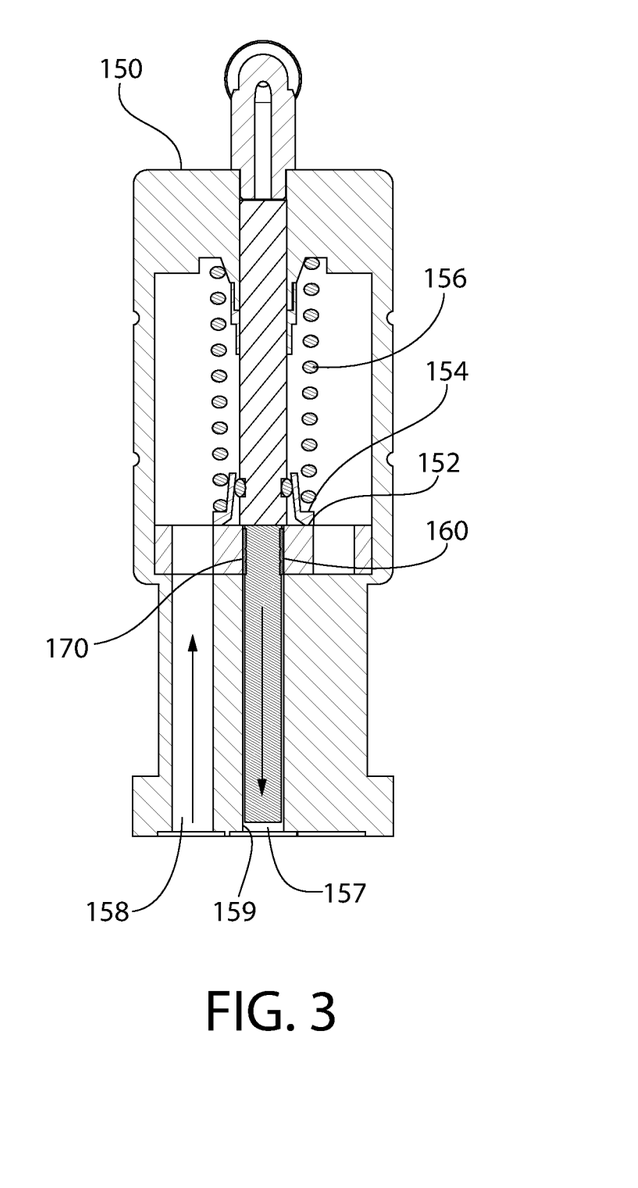
FIG. 3 is a schematic view of a valve incorporating a first embodiment of a flow restrictor and seal as may be utilized in the mass flow controller of FIG. 2.

Turning to FIG. 3, a schematic of an on/off valve 150 is shown with a first embodiment of the flow restrictor 160 located within an outlet passage 157 of the on/off valve 150. The on/off valve 150 has an inlet passage 158 which allows process gas to flow into the valve 150. A spring 156 biases a closure member 154 into contact with a valve seat 152, preventing process gas from flowing when the valve 150 is in a closed state. When in an open state, the closure member 154 is moved so that it is spaced from the valve seat 152, allowing process gas to pass the valve seat 152 into the outlet 157. The outlet 157 is formed as a cylindrical bore, but may also be formed as an oval, polygon, or any other shape. The flow restrictor 160 is inserted into the outlet 157 with a seal 170 preventing gas flow between the flow restrictor 160 and the wall 159 of the outlet 157.

Figure 4:
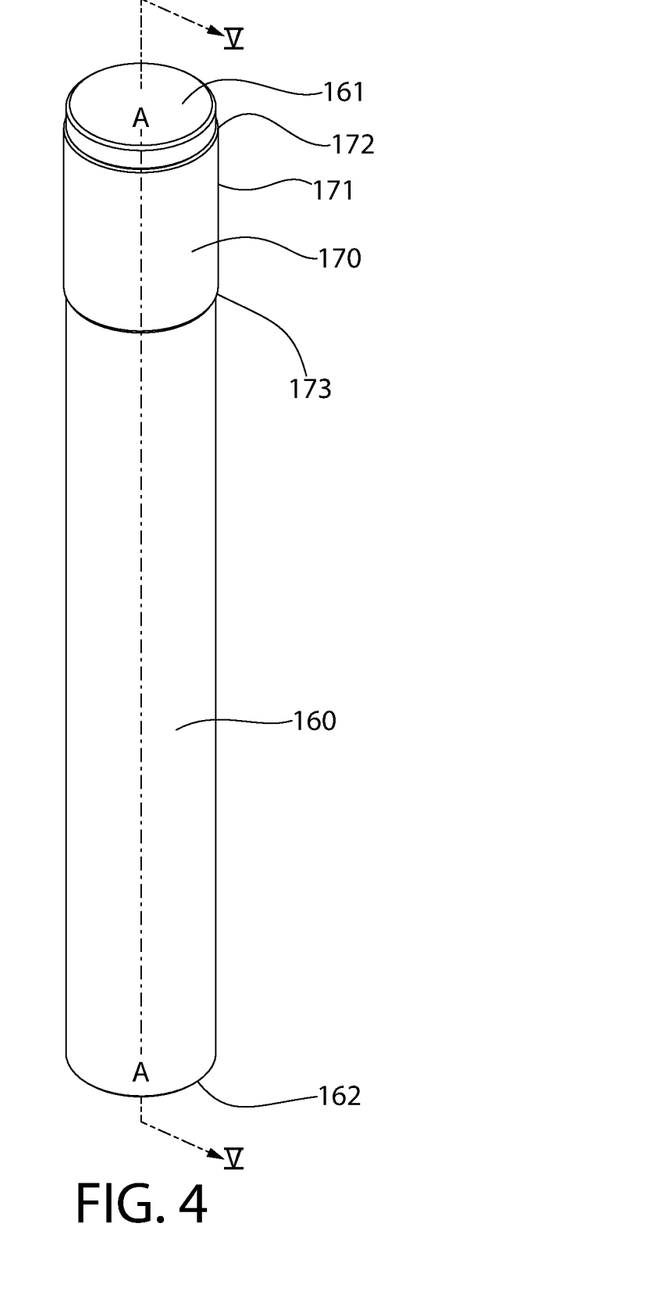
FIG. 4 is a perspective view of the first embodiment of the flow restrictor and seal as may be utilized in the valve of FIG. 3.

Turning to FIGS. 4-7, the flow restrictor 160 and the seal 170 are shown in greater detail. FIG. 4 shows a perspective view of the flow restrictor 160 and the seal 170. The flow restrictor 160 extends from a first end 161 to a second end 162 along a longitudinal axis A-A. The seal 170 is fitted to the flow restrictor 160. The seal 170 circumferentially surrounds the flow restrictor 160 and has an outer surface 171. The seal 170 extends between a first end 172 and a second end 173 along a longitudinal axis B-B. The longitudinal axis B-B of the seal 170 is collinear with the longitudinal axis A-A of the flow restrictor 160. However, in alternate embodiments, the longitudinal axis B-B of the seal 170 may not be collinear with the longitudinal axis A-A of the flow restrictor 170. In some embodiments, the longitudinal axis B-B of the seal is angled with respect to the longitudinal axis A-A of the flow restrictor 160. In yet other embodiments, the longitudinal axis B-B of the seal may be spaced but parallel to the longitudinal axis A-A of the flow restrictor 160. In yet other embodiments, the axes may be both angled and spaced from one another.

Figure 5:
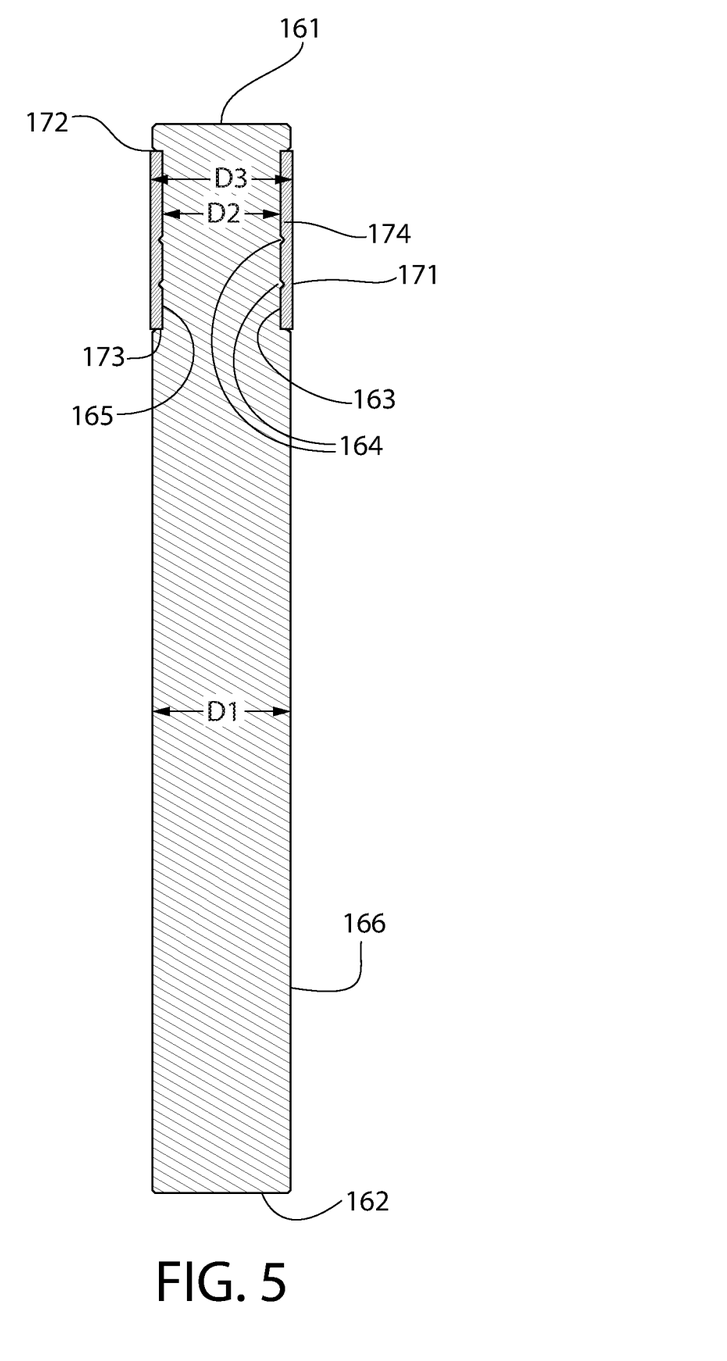
FIG. 5 is a cross-sectional view of the flow restrictor and seal of FIG. 4, taken along line V-V.
Figure 6:
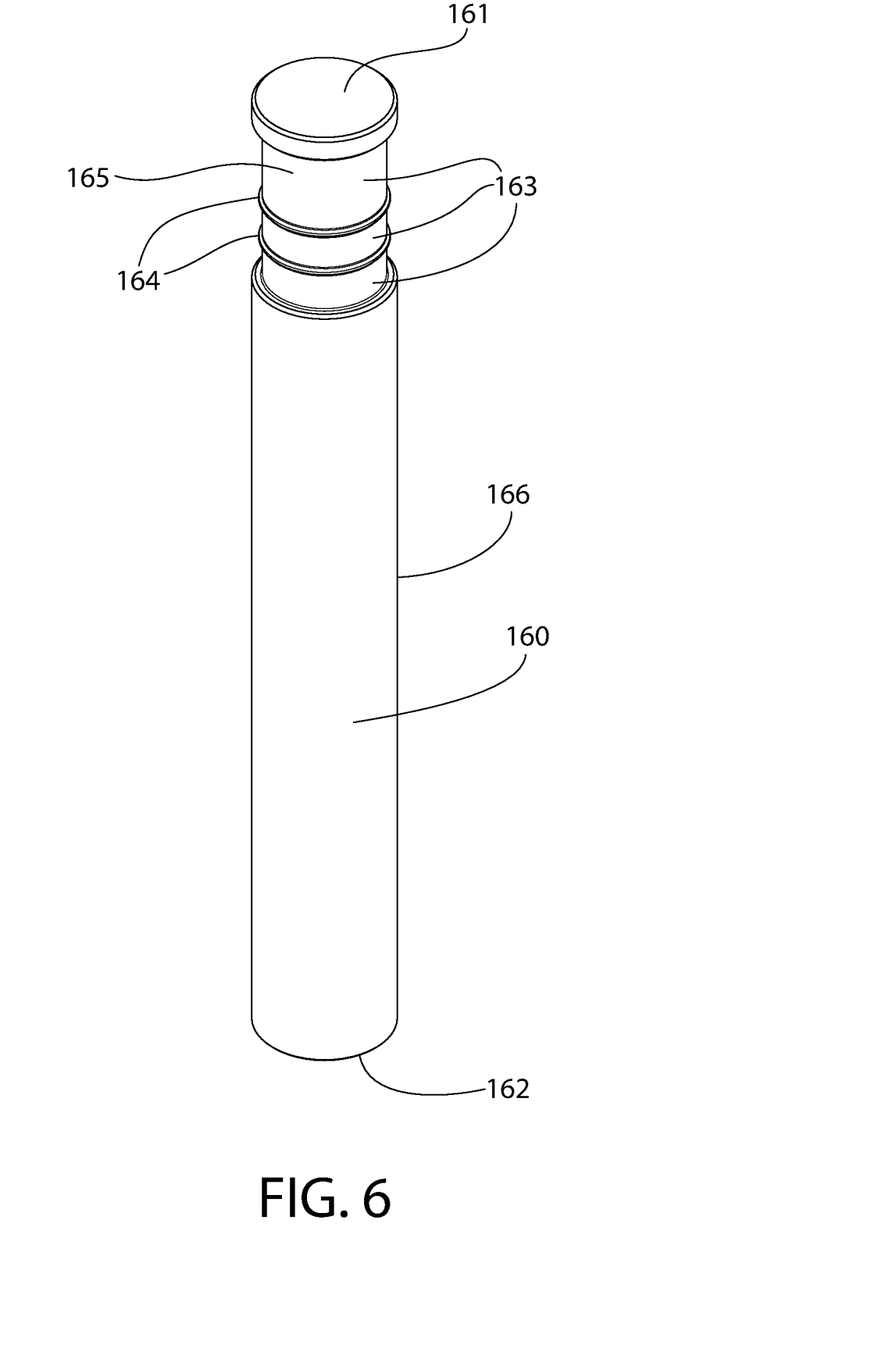
FIG. 6 is a perspective view of the flow restrictor of FIG. 4 without the seal.
Figure 7:
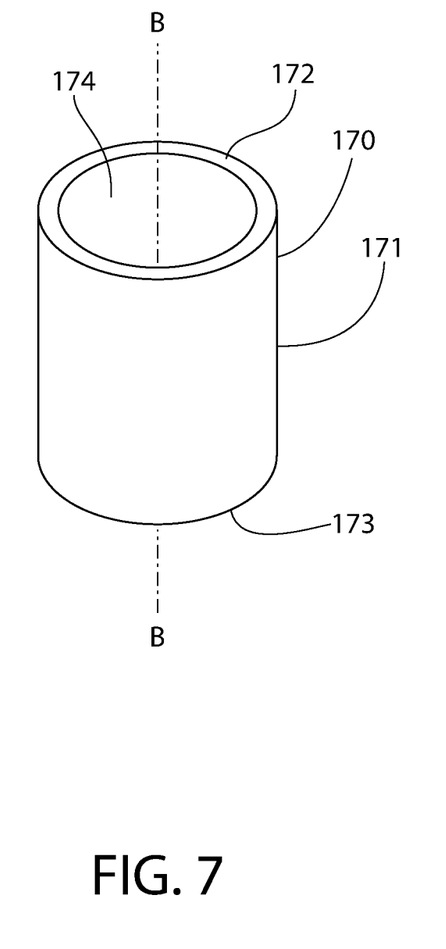
FIG. 7 is a perspective view of the seal of FIG. 4 without the flow restrictor.

As best seen in FIG. 5, the flow restrictor 160 has a sealing portion 163 and an unsealed portion 166. The unsealed portion 166 has a first diameter D1 and the sealing portion 163 has a second diameter D2, the first diameter D1 being greater than the second diameter D2. The seal 170 further comprises an inner surface 174 which is in surface contact with the sealing portion 163 of the flow restrictor 160. The outer surface 171 has a third diameter D3 which is greater than either of the first and second diameters D1, D2. This results in an interference fit between the wall 159 and the outer surface 171 and ensures that the seal 170 seals against the wall 159 of the outlet 157 while simultaneously preventing contact between the flow restrictor 160 and the wall 159. The inner surface 174 defines an aperture through which the flow restrictor 160 is received and through which all gas flows generally along the axis B-B from the first end 161 to the second end 162 of the flow restrictor 160. In yet other embodiments, the sealing portion 163 extends the entire length of the flow restrictor 160. In yet further embodiments, the first diameter D1 may be the same diameter as the second diameter D2. Preferably, the third diameter D3 has an interference fit with the wall 159. The third diameter D3 may also be the same diameter as the second diameter D2. Furthermore, the gas need not enter from the first end 161 and exit the second end 162 of the flow restrictor, but may also enter through the circumference of the flow restrictor 160. Flow of gas within the flow restrictor 160 need not flow strictly along the axis B-B, but need only pass through the flow restrictor 160 and past the seal 170 rather than around it.

The sealing portion 163 has a seal receiving surface 165 and a plurality of ridges 164 used to improve sealing and retain the seal in place. The second diameter D2 is reduced as compared with the first diameter D1 so as to provide room for the seal 170 and enhance retention of the seal 170 on the flow restrictor 160. The ridges 164 have a triangular cross-section and encircle the flow restrictor 160. When the seal 170 is installed onto the sealing portion 163 of the flow restrictor 160, the ridges 164 deform the seal 170 to further enhance the retention of the seal 170. This ensures that the seal 170 is maintained on the flow restrictor 160 when the flow restrictor is pressed into the outlet 157. The third diameter D3 is typically an interference fit with the outlet 157, so substantial force may be required to press the seal 170 into the outlet 157 depending on the extent of the interference. In the exemplary embodiment, the sealing portion 163 has two ridges 164. In alternate embodiments, the sealing portion 163 may have greater or fewer ridges 164. The cross-sectional profile of the ridges 164 may be rectangular, trapezoidal, or any other shape. In yet further variations, a texture may be formed on the seal receiving surface 165. This texture may be formed by knurling, grinding, or any other known process. In alternate embodiments, a single model of flow restrictor 160 may be installed into a plurality of outlets 157 having differing diameters by modifying the thickness of the seal such that the third diameter D3 is modified to have a suitable interference with the wall 159 of each of the respective outlets 157. This configuration beneficially allows the restrictor to be installed directly against the seat of the valve, greatly reducing the volume enclosed between the valve seat and the flow restrictor 160. In addition, multiple valve geometries, bore sizes, and fitting geometries can be accommodated by positioning the flow restrictor 160 within the outlet 157.

In use, process gas flows through the flow restrictor 160 from the first end 161 to the second end 162. The seal 170 provides a close fit with both the flow restrictor 160 and the wall 159 of the outlet 157 so as to prevent process gas from flowing around the flow restrictor 160. Although some leakage of gas is possible, this leaking is reduced to at least $1\times10^{-7}$ atm-cc/sec when Helium is used as a process gas. This leak rate ensures that a negligible volume of process gas flows around the flow restrictor 160 rather than through the flow restrictor 160.

The seal 170 is preferably formed of a non-metallic material such as a plastic material. One exemplary material could be Polytetrafluoroethylene (also known as "PTFE" or "Teflon"). Alternate materials may include metals, ceramics, or composite materials. The seal 170 is preferably shrunk or stretched onto the flow restrictor 160 so as to ensure a tight fit between the seal receiving surface 165 and the inner surface 174. However, other methods are contemplated. In yet further embodiments, the seal may be welded, bonded, or pressed onto the flow restrictor 160 so as to achieve a secure gas tight connection between the seal 170 and the flow restrictor 160. In yet another embodiment, a plurality of identical flow restrictors 160 are mounted to differing seals 170 to allow installation into different size outlets 157.

Figure 8:
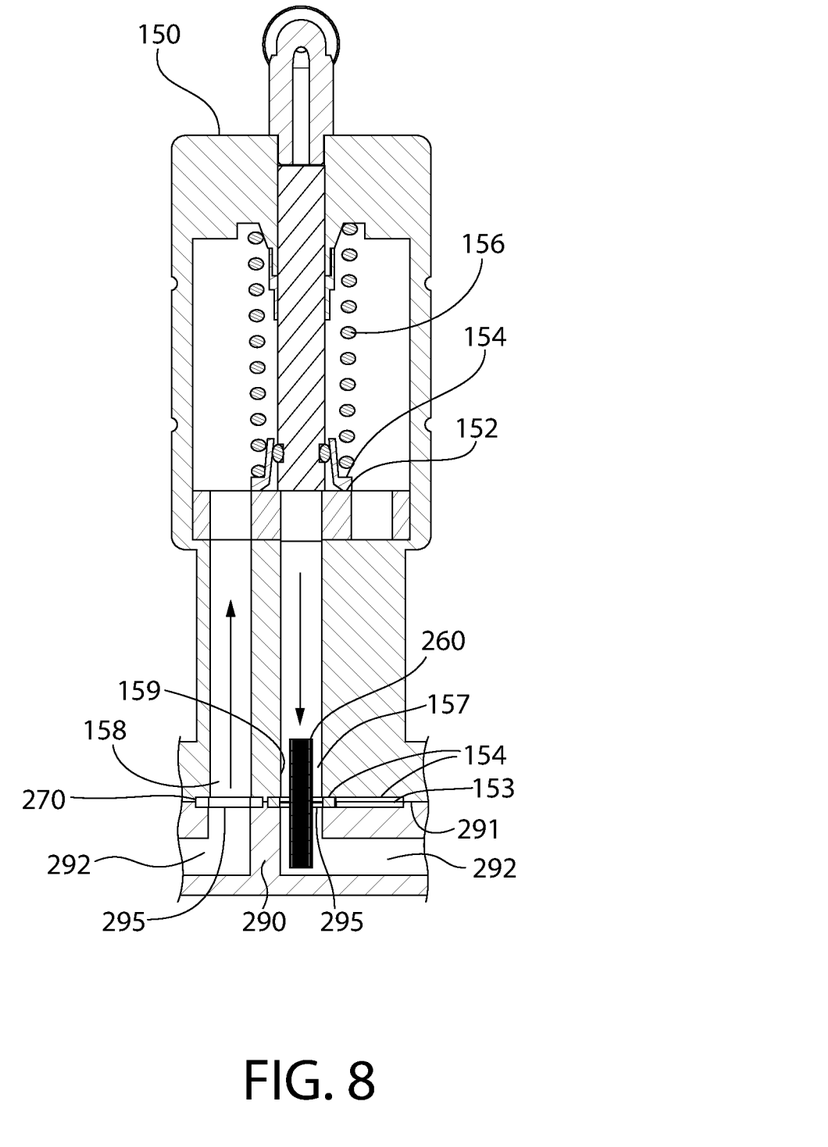
FIG. 8 is a schematic view of a valve incorporating a second embodiment of a flow restrictor and seal as may be utilized in the mass flow controller of FIG. 2.
Figure 9:
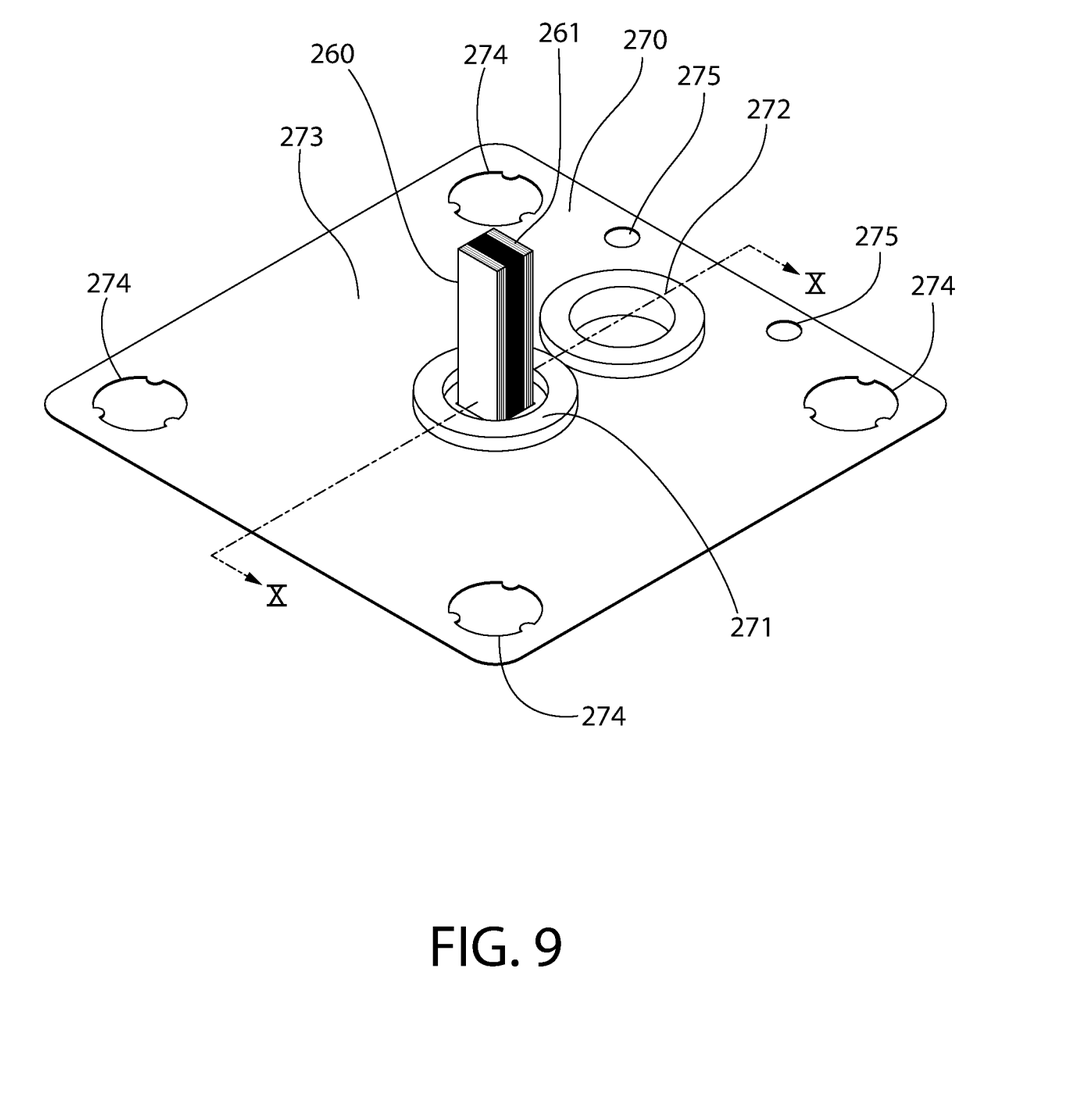
FIG. 9 is a perspective view of the second embodiment of the flow restrictor and seal as may be utilized in the valve of FIG. 8.
Figure 10:
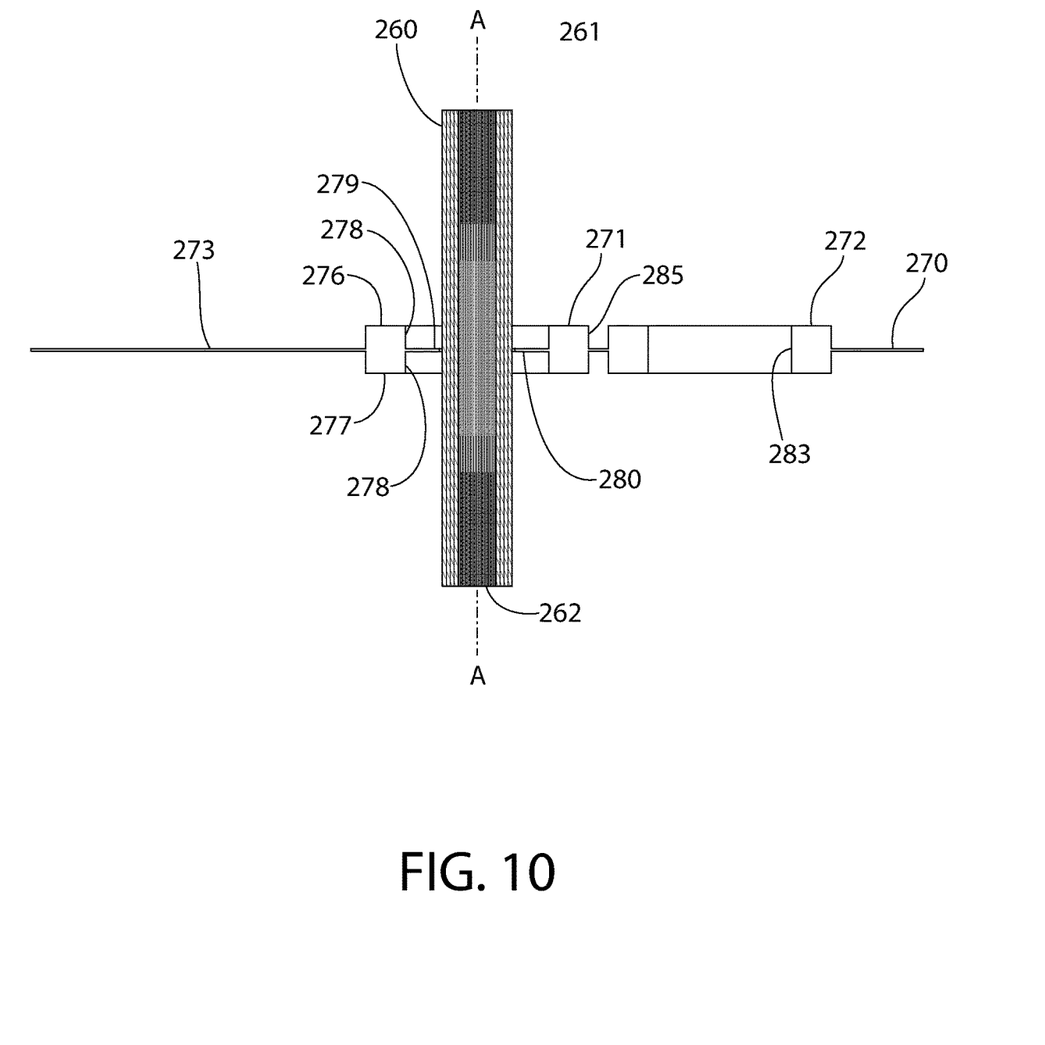
FIG. 10 is a cross-sectional view of the flow restrictor and seal of FIG. 9, taken along line X-X.

Turning to FIGS. 8-14, a second embodiment of a flow restrictor 260 is shown with a seal 270. As can be seen in the schematic of FIG. 8, a valve 150 is illustrated. The valve 150 is substantially identical to the valve 150 of FIG. 3. However, instead of having a flow restrictor pressed into the outlet 157, a seal 270 is mounted between a sealing surface 153 of the valve 150 and a sealing surface 291 of a base 290, the base 290 comprising flow passages 292 which connect the on/off valve 150 to the various components of the mass flow controller 101 or other apparatus for controlling flow 100. The seal 270 is installed between the sealing surface 153 and the sealing surface 291 and has a first seal ring 271 and a second seal ring 272 as best shown in FIGS. 9 and 10. The first seal ring 271 and second seal ring 272 are mounted to a gasket sheet 273 and extend beyond the gasket sheet 273 to engage sealing recesses 155, 295 of the valve 150 and the base 290, respectively. A plurality of apertures 274 are provided through the gasket sheet 273 to allow the passage of fasteners used to join the valve 150 to the base 290.

Additional holes 275 may be used to facilitate manufacturing of the seal 270 or for other purposes such as to seal additional flow passages.

Figure 11:
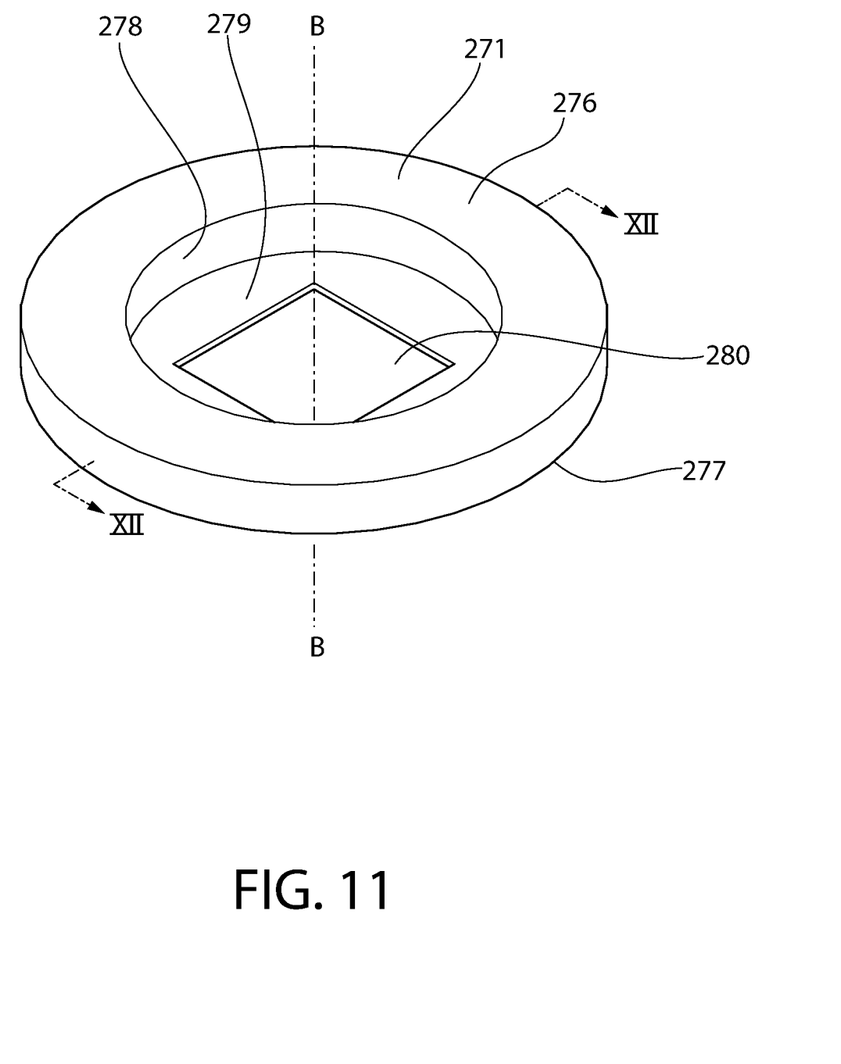
FIG. 11 is a perspective view of the seal of FIG. 9 without the flow restrictor.
Figure 12:
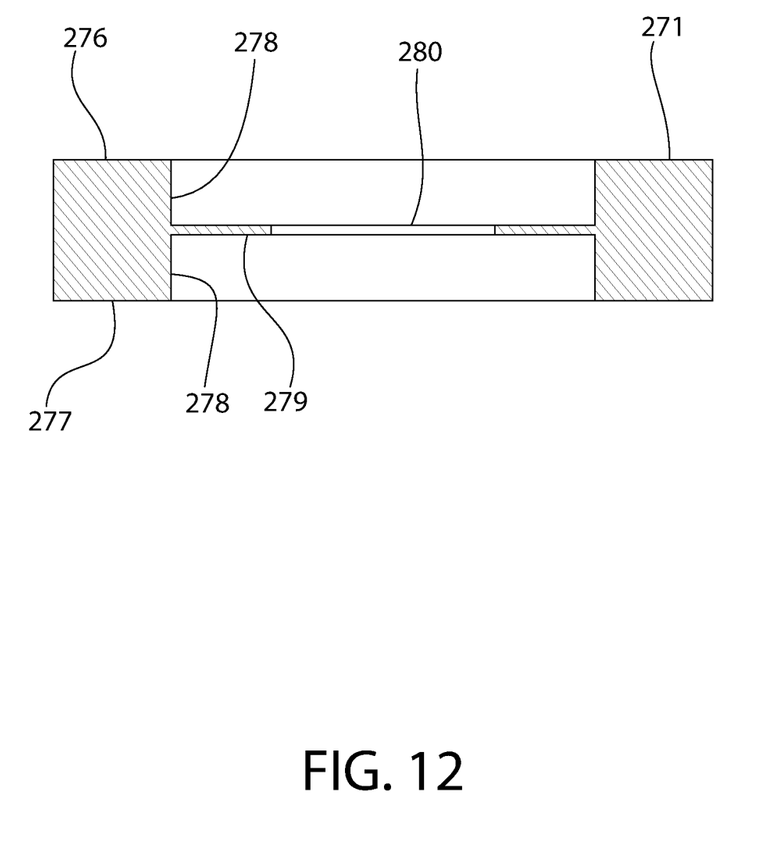
FIG. 12 is a cross-sectional view of the seal of FIG. 11, taken along line XII-XII.
Figure 13:
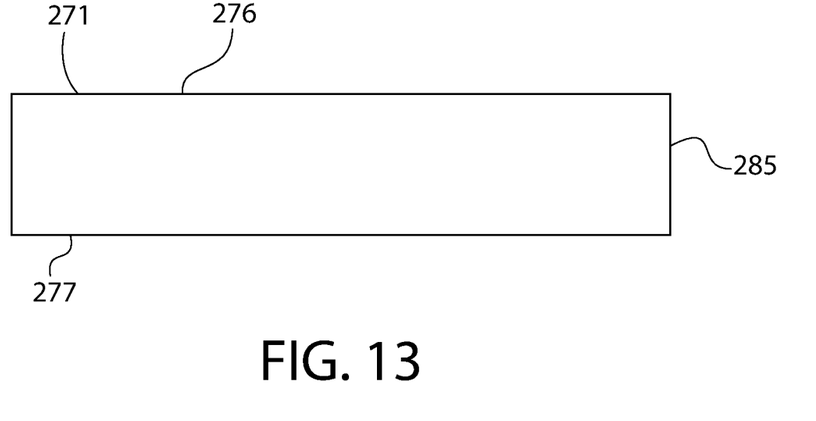
FIG. 13 is a front view of the seal of FIG. 11.
Figure 14:
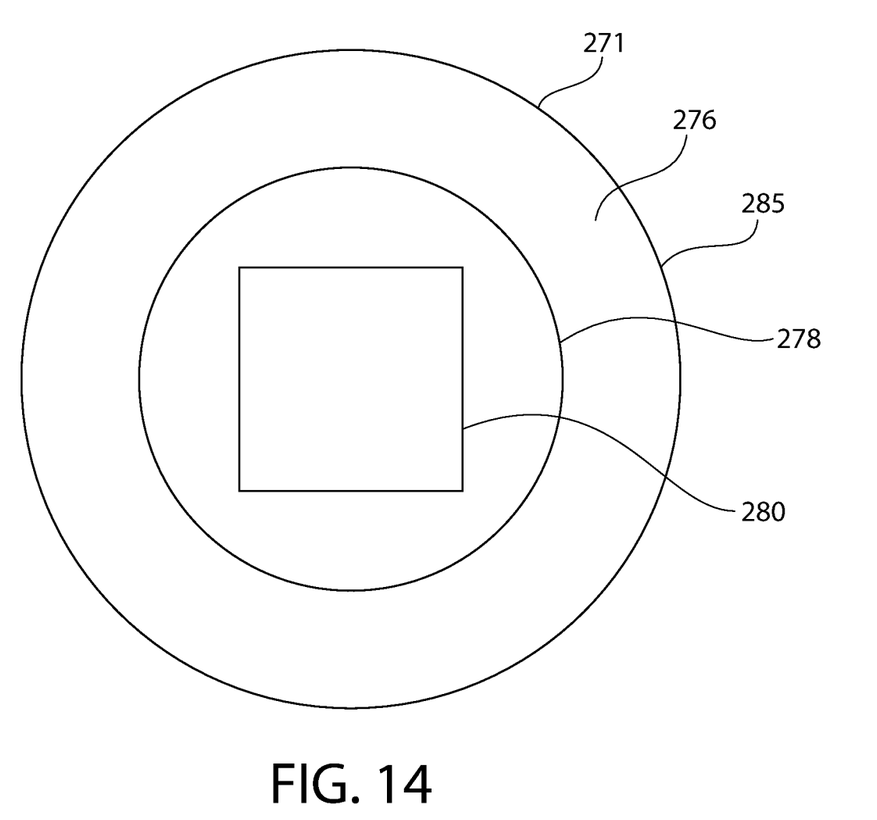
FIG. 14 is a top view of the seal of FIG. 11.

As can be seen in FIG. 10, the first seal ring 271 of the seal 270 receives the flow restrictor 260. The flow restrictor 260 extends from a first end 261 to a second end 262 along a longitudinal axis A-A. As best seen in FIGS. 10 and 11, the first seal ring 271 has a first side 276 and a second side 277 opposite the first side 276, a longitudinal axis B-B extending through the first seal ring 271 perpendicular to the first and second sides 276, 277. The first and second sides 276, 277 engage the sealing recesses 155, 295 and are compressed between them when the valve 150 is mounted to the base 290. The first seal ring 271 also has an inner surface 278 which is generally cylindrical and a sealing web 279 which extends across the inner surface 278. A flow aperture 280 is formed in the sealing web 279 to receive the flow restrictor 260. The flow aperture 280 has a generally rectangular shape in the present embodiment, but in other embodiments it may be circular, elliptical, or any other shape suitable to accommodate a corresponding flow restrictor. The flow restrictor 260 has a generally rectangular profile along the longitudinal axis and is a close fit within the flow aperture 280. Once the flow restrictor 260 is installed in the flow aperture 280, it can be welded, bonded, or press fit to achieve a gas tight seal between the outer surface of the flow restrictor 260 and the sealing web 279, ensuring that no process gas escapes past the flow restrictor 260 without passing through the flow restrictor 260. The first seal ring 271 also has an outer surface 285 which may be of any size or diameter so long as the first seal ring 271 can nest within the sealing recesses 155, 295. In alternate configurations, the sealing recesses 155, 295 may be omitted. In yet further configurations, the inner surface 278 and outer surface 285 need not be cylindrical, and may be rectangular, ellipsoid, polygonal, or any other shape.

The second seal ring 272 also has a first side 281 and a second side 282. However, the second seal ring 272 differs from the first seal ring 271 in that it has no corresponding sealing web. Instead, the inner surface 283 defines a flow aperture that enables the passage of process gas without significant flow impedance. Ideally, the flow passages and the second seal ring 272 provide no restriction to fluid flow. In alternate embodiments, the seal 270 may comprise only the first seal ring 271 and be free of the second seal ring 272 or any other components. Alternately, there may be more than one of the first or second seal rings 271, 272.

In alternate embodiments, the flow aperture 280 of the first seal ring 271 may be circular, rectangular, have a polygon shape, may comprise arcs, or may have any known shape. Thus, any cross-section of flow restrictor may be accommodated in the seal ring 271. In yet further embodiments, the seal ring 271 may be press fit, welded, bonded, or otherwise secured directly within a flow passage such as the outlet 157 of the valve 150 or the flow passages 292 of the base 290. In yet further embodiments, the gasket sheet 273 maybe omitted, such that the seal is comprised only of the seal ring 271. The seal 270 is preferably constructed at least partially of a metal material. In the most preferred embodiments, the first and second seal rings 271, 272 are metallic.

During assembly, the seal 270 is placed between the valve 150 and the base 290 and aligned so that the first and second seal rings 271, 272 align with the sealing recesses 155, 295. The flow restrictor 260 then extends into the outlet 157 and the corresponding flow passage 292 in the base 290. The flow restrictor 260 may be attached to the first seal ring 271 so that the seal is halfway along the length of the flow restrictor 260, or it may be attached at any point along the length of the flow restrictor 260. It may even be attached substantially flush with either the first or second end 261, 262. Furthermore, the seal 270 may be installed such that it is located within a portion of the valve 150 to minimize the distance between the valve seat 152 and the flow restrictor 260, minimizing the volume therebetween. As noted previously, the seal 270 may also be configured so that the flow restrictor 260 is positioned upstream of the valve seat 152 and positioned in the inlet 158 instead of the outlet 157. The seal of this embodiment can reliably produce a seal with a Helium leak rate better than $1 \times 10^{-11}$ atm-cc/sec, substantially eliminating all flow of process gas around the flow restrictor 260.

While the invention has been described with respect to specific examples including presently preferred modes of carrying out the invention, those skilled in the art will appreciate that there are numerous variations and permutations of the above described systems and techniques. It is to be understood that other embodiments may be utilized, and structural and functional modifications may be made without departing from the scope of the present invention. Thus, the spirit and scope of the invention should be construed broadly as set forth in the appended claims.

What is claimed is:

1. A valve assembly comprising:
   a valve comprising a passage, a closure member, and a valve seat, the passage having a wall;
   a flow restrictor, the flow restrictor comprising:
      a first end;
      a second end;
      a longitudinal axis extending from the first end to the second end; and
      a sealing portion located between the first end and the second end along the longitudinal axis; and
   a seal proximate the valve seat, the seal in contact with the sealing portion of the flow restrictor, the seal sealing the passage of the valve, the seal being elongate along the longitudinal axis;
   wherein at least a portion of the flow restrictor is spaced and isolated from the wall of the passage, the flow restrictor extending beyond the seal along the longitudinal axis.

2. The valve assembly of claim 1 wherein the seal is formed of polytetrafluorethylene.

3. The valve assembly of claim 1 wherein the seal is non-metallic.

4. The valve assembly of claim 1 wherein the seal extends from a first end to a second end along the longitudinal axis.

5. The valve assembly of claim 1 wherein the flow restrictor further comprises ridges, the seal being in contact with the ridges.

6. The valve assembly of claim 1 wherein the flow restrictor further comprises an unsealed portion, the unsealed portion having a first diameter and the sealing portion having a second diameter; wherein the first diameter is greater than the second diameter; and wherein an outer surface of the seal has a third diameter, the third diameter greater than the first and second diameters.

7. The valve assembly of claim 1 wherein an outer surface of the seal is in contact with an inner surface of the passage of the valve.

8. A valve assembly comprising:
   a valve comprising a passage, a closure member, and a valve seat;
   a flow restrictor, the flow restrictor comprising:
      a first end;

a second end;

a longitudinal axis extending from the first end to the second end; and a sealing portion located between the first end and the second end along the longitudinal axis; and a seal proximate the valve seat, the seal in contact with the sealing portion of the flow restrictor to seal the flow restrictor within the passage of the valve, the seal being elongate along the longitudinal axis, an unsealed portion of the flow restrictor spaced and isolated from a wall of the passage, the unsealed portion extending along the longitudinal axis.

9. The valve assembly of claim 8 wherein the seal is formed of polytetrafluoroethylene.

10. The valve assembly of claim 8 wherein the seal extends from a first end to a second end along the longitudinal axis.

11. The valve assembly of claim 8 wherein the seal has a substantially constant thickness measured perpendicular to the longitudinal axis.

12. The valve assembly of claim 8 wherein the sealing portion of the flow restrictor comprises a plurality of ridges, the plurality of ridges engaging an inner surface of the seal.

13. The valve assembly of claim 8 wherein the passage extends through the valve seat, the seal engaging the passage adjacent the valve seat.

14. A valve assembly comprising:

a valve comprising a passage, a closure member, and a valve seat;

a flow restrictor, the flow restrictor comprising:

a first end;

a second end;

a longitudinal axis extending from the first end to the second end;

a sealing portion extending from the first end along the longitudinal axis; and an unsealed portion extending from the sealing portion to the second end; and a seal proximate the valve seat, the seal in contact with the sealing portion of the flow restrictor to seal the flow restrictor within the passage of the valve, the unsealed portion of the flow restrictor spaced and isolated from a wall of the passage.

15. The valve assembly of claim 14 wherein the seal is formed of polytetrafluoroethylene.

16. The valve assembly of claim 14 wherein the seal extends from a first end to a second end along the longitudinal axis, the seal being elongate along the longitudinal axis.

17. The valve assembly of claim 14 wherein the seal has a substantially constant thickness measured perpendicular to the longitudinal axis.

18. The valve assembly of claim 14 wherein the seal has a thickness measured perpendicular to the longitudinal axis and a length measured parallel to the longitudinal axis, the length being greater than the thickness.

19. The valve assembly of claim 14 wherein the sealing portion of the flow restrictor comprises a plurality of ridges, the plurality of ridges engaging an inner surface of the seal.

20. The valve assembly of claim 14 wherein the passage extends through the valve seat, the seal engaging the passage adjacent the valve seat.

* * * * *